(12) United States Patent
Oh

(10) Patent No.: US 7,410,842 B2
(45) Date of Patent: Aug. 12, 2008

(54) METHOD FOR FABRICATING THIN FILM TRANSISTOR OF LIQUID CRYSTAL DISPLAY DEVICE

(75) Inventor: Kum-Mi Oh, Seoul (KR)

(73) Assignee: LG. Display Co., Ltd, Seoul (KR)

( * ) Notice: Subject to any disclaimer, the term of this patent is extended or adjusted under 35 U.S.C. 154(b) by 362 days.

(21) Appl. No.: 11/211,212

(22) Filed: Aug. 19, 2005

(65) Prior Publication Data

US 2006/0234429 A1  Oct. 19, 2006

(30) Foreign Application Priority Data

Apr. 19, 2005 (KR) ............... 10-2005-0032484
Aug. 18, 2005 (KR) ............... 10-2005-0075838

(51) Int. Cl.
*H01L 21/70* (2006.01)
(52) U.S. Cl. ............... 438/154; 257/E29.278
(58) Field of Classification Search ......... 438/141–166
See application file for complete search history.

(56) References Cited

U.S. PATENT DOCUMENTS

| | | | | |
|---|---|---|---|---|
| 6,448,117 B1 * | 9/2002 | Jen et al. | .......... | 438/160 |
| 6,818,922 B2 * | 11/2004 | Chen | .......... | 257/66 |
| 6,972,820 B2 * | 12/2005 | Lee et al. | .......... | 349/152 |
| 7,023,017 B2 * | 4/2006 | Ahn et al. | .......... | 257/59 |
| 7,041,522 B2 * | 5/2006 | Tanaka et al. | .......... | 438/30 |
| 7,161,648 B2 * | 1/2007 | Lim et al. | .......... | 349/114 |
| 7,173,675 B2 * | 2/2007 | Yang et al. | .......... | 349/43 |
| 7,217,586 B2 * | 5/2007 | Lee et al. | .......... | 438/34 |
| 7,256,060 B2 * | 8/2007 | Park | .......... | 438/30 |

| | | |
|---|---|---|
| 2002/0121639 A1 | 9/2002 | So et al. |
| 2003/0127652 A1 | 7/2003 | Park et al. |
| 2004/0051101 A1 * | 3/2004 | Hotta et al. ............ 257/72 |

(Continued)

FOREIGN PATENT DOCUMENTS

KR    2005-03496    1/2005

(Continued)

OTHER PUBLICATIONS

Search Report dated Mar. 7, 2006 for corresponding British Patent Application No. 0522590.9.

(Continued)

*Primary Examiner*—Savitri Mulpuri
(74) *Attorney, Agent, or Firm*—Brinks Hofer Gilson & Lione

(57) ABSTRACT

A method for fabricating a thin film transistor for an LCD device is presented that uses six mask processes. Portions of a semiconductor layer formed on a substrate are doped with first and second impurities in different regions. A conductive layer is deposited and the conductive and semiconductor layers patterned together by diffraction exposure using a diffraction pattern mask to define source and drain regions and an activate region. Ashing is performed and portions of the conductive layer removed to form the source, drain and channel. A gate insulating layer is formed on the substrate and gates are formed on the gate insulating layer. A passivation film is formed on the substrate and a pixel contact hole exposing one of the drains is etched. A pixel electrode is then deposited such that the pixel electrode is connected to the drain through the pixel contact hole.

12 Claims, 15 Drawing Sheets

U.S. PATENT DOCUMENTS

| | | |
|---|---|---|
| 2004/0135216 A1 | 7/2004 | Suzawa et al. |
| 2005/0088086 A1 | 4/2005 | Park et al. |
| 2005/0142680 A1 | 6/2005 | Ha et al. |
| 2005/0270453 A1* | 12/2005 | Jung et al. .................. 349/114 |
| 2006/0138426 A1* | 6/2006 | Yoo et al. ..................... 257/72 |
| 2006/0145162 A1* | 7/2006 | Yang ........................... 257/72 |

FOREIGN PATENT DOCUMENTS

| | | |
|---|---|---|
| KR | 2004-59157 | 7/2005 |

OTHER PUBLICATIONS

Office Action dated Oct. 26, 2006 for corresponding Korean Patent Application No. 10-2005-0075838.

* cited by examiner

US 7,410,842 B2

METHOD FOR FABRICATING THIN FILM TRANSISTOR OF LIQUID CRYSTAL DISPLAY DEVICE

PRIORITY

This application claims the benefit of priority to Korean Patent Applications 32484/2005, filed on Apr. 19, 2005 and 75838/2005, filed on Aug. 18, 2005, which are incorporated herein by references.

FIELD OF THE INVENTION

The present invention relates to a method for fabricating a liquid crystal display (LCD) device, and more particularly, to a method for fabricating an LCD device using a diffraction exposure in a top-gate type polysilicon CMOS process.

BACKGROUND OF THE INVENTION

Recently, LCD devices are being spotlighted as the next generation high-tech display devices due to their low consumption power, excellent portability, and high added value. The LCD device contains liquid crystal between an array substrate including a thin film transistor (TFT) and a color filter substrate. The LCD device uses a refraction difference due to anisotropy of the liquid crystal to display an image.

One LCD device currently in use is an active matrix liquid crystal display (AM-LCD) that contains TFTs and pixel electrodes arranged in a matrix. The AM-LCD has excellent resolution and displays moving images well. Hydrogenated amorphous silicon (a-Si:H) is mainly used in the TFT because it can be fabricated using a low temperature process and a cheap insulating substrate. However, hydrogenated amorphous silicon has an irregular atom arrangement, thus having weak Si—Si bonds and dangling bonds. Accordingly, the amorphous silicon is converted into a quasi-stable state when irradiated with light or a magnetic field is applied thereto. Therefore, when the amorphous silicon is utilized in a thin film transistor device, a problem regarding the stability is generated. Also, since the amorphous silicon has small field effect mobility (0.1-1.0 cm$^2$/V*s), the amorphous silicon can not be used in a driving circuit.

Recently, an LCD device that uses a poly-silicon thin film transistor is being researched and developed. Since poly-silicon has a field effect mobility larger than that of amorphous silicon by 100 to 200 times, the response speed thereof is fast and the stability against temperature and light is excellent. Also, poly-silicon has an advantage in that a driving circuit can be formed on the same substrate.

The conventional method for fabricating a thin film transistor using poly-silicon for an LCD device will be explained in more detail with reference to the attached drawings as follows.

FIG. 1 is a schematic view showing an LCD device where a driving circuit portion is formed in accordance with the conventional art.

Referring to FIG. 1, a driving circuit portion 5 and a pixel portion 3 are formed on an insulating substrate 1. The pixel portion 3 is arranged at the center of the insulating substrate 1. Also, a gate driving circuit portion 5a and a data driving circuit portion 5b are respectively arranged at one side and another side of the pixel portion 3 perpendicular to each other. At the pixel portion 3, a plurality of gate lines 7 connected to the gate driving circuit portion 5a and a plurality of data lines 9 connected to the data driving circuit portion 5b crossed each other. A pixel electrode 10 is formed at a pixel region P defined by the area bounded by adjacent gate lines 7 and adjacent data lines 9. Also, a thin film transistor T connected to the pixel electrode 10 is formed at an intersection of each of the gate lines 7 and data lines 9.

The gate driving circuit portion 5a and the data driving circuit portion 5b are respectively connected to an external signal input terminal 12. The gate driving circuit portion 5a and the data driving circuit portion 5b control external signals inputted through the external signal input terminal 12 therein, and then supply display control signals and data signals to the pixel portion 3 through the gate lines 7 and the data lines 9.

A thin film transistor (not shown) having a complementary metal-oxide semiconductor (CMOS) structure as an inverter is formed in the driving circuit portion in order for the gate driving circuit portion 5a and the data driving circuit portion 5b to properly output inputted signals. The CMOS structure is used in a driving circuit portion thin film transistor requiring fast signal processing. The n and p type semiconductors in the CMOS structure are electrically controlled by a reciprocal complement method in order to control a current passing therethrough.

The n type TFT structure, the p type TFT structure of the driving circuit portion which are the CMOS structure, and a switching device of the pixel portion of the array substrate will be explained with reference to FIG. 2 as follows. FIG. 2 is a section view showing a switching device of a pixel portion and a thin film transistor having a CMOS structure of the driving circuit portion in accordance with the conventional art.

Referring to FIG. 2, in the conventional switching device I of the pixel portion, a buffer layer 25 formed of an inorganic insulating material such as SiO$_2$ is formed on an entire surface of the substrate 20. A semiconductor layer 30 is formed on the buffer layer 25, and a gate insulating layer 45 is formed on an entire surface of the semiconductor layer 30.

A gate electrode 50 is formed on the gate insulating layer 45, and an inter-insulating layer is formed on the gate electrode 50. Semiconductor layer contact holes 73a and 73b for contacting the semiconductor layer 30 are formed at the gate insulating layer 45 and the inter-insulating layer 70. A source electrode 80a and a drain electrode 80b respectively connected to the semiconductor layer contact holes 73a and 73b and spaced from the gate electrode 50 with a certain interval are formed on the inter-insulating layer 70.

A passivation film 90 including a drain electrode contact hole 95 is formed on the drain electrode 80b, and a pixel electrode 97 connected to the drain electrode 80 through the drain electrode contact hole 95 is formed on the passivation film 90.

The semiconductor layer 30 positioned at a lower region of the gate insulating layer 45 corresponding to the gate electrode 50 forms an active layer 30a, and the semiconductor layer 30 positioned at lower regions of the gate insulating layer 45 contacting the source and drain electrodes 80a and 80b are n$^+$ doped thereby to form an n-type ohmic contact layer 30c. An n$^-$ doped light doped drain (LDD) layer 30b is formed between the active layer 30a and the n-type ohmic contact layer 30c. The LDD layer 30b is doped with a low concentration to disperse hot carriers, thereby preventing current leakage and preventing the loss of turned-on current.

In more detail, a channel layer, an ohmic layer, an LDD layer, a gate, and source/drains of the thin film transistor having the CMOS structure of the driving circuit portion are formed by the same processes as those for forming a channel layer, an ohmic layer, an LDD layer, a gate, and source/drains of the switching device of the pixel portion. The thin film transistor having the CMOS structure of the driving circuit portion has a thin film transistor portion II including an n+ doped semiconductor layer 35, and a thin film transistor portion III including a p+ doped semiconductor layer 40. Reference numerals will be given to the same device in the order of II and III for the convenience.

The n-type semiconductor layer 35 and the p-type semiconductor layer 40 are formed on the transparent insulating substrate 20 on which the buffer layer 25 is formed with a predetermined gap, and the gate insulating layer 45 is formed on the entire surfaces of the n-type semiconductor layer 35 and the p-type semiconductor layer 40. Gate electrodes 55 and 60 are formed on the gate insulating layer 45.

The inter-insulating layer 70 including semiconductor layer contact holes 75a, 75b, 77a, and 77b is formed on the entire surface of the substrate on which the gate electrodes 55 and 60 are formed. Source electrodes 83a and 87a and drain electrodes 83b and 87b respectively contacting the n-type semiconductor layer 35 and the p-type semiconductor layer 40 through the semiconductor layer contact holes 75a, 75b, 77a, and 77b are formed on the inter-insulating layer 70. The passivation film 90 is formed on the entire surfaces of the source and drain electrodes 83a, 87a, 83b, and 87b.

The n-type semiconductor layer 35 which is positioned at a lower region of the gate insulating layer 45 corresponding to the gate electrode 55 forms an active layer 30a, and the n-type semiconductor layer 35 positioned at lower regions of the gate insulating layer 45 contacting the source and drain electrodes 83a and 83b form an $n^+$ doped n-type ohmic contact layer 35c. An $n^-$ doped light doped drain (LDD) layer 35b is formed between the active layer 35a and the n-type ohmic contact layer 35c

In the p-type semiconductor layer 40, holes are the carriers. Thus, carrier degradation and current leakage are not large when compared with the n-type thin film transistor. Thus, formation of an LDD layer may be avoided. The semiconductor layer positioned at a lower region of the gate insulating layer 45 corresponding to the gate electrode 60 forms an active layer 40a, and peripheral regions of the active layer 40a form a p-type ohmic contact layer 40c.

A method for fabricating the switching device of the pixel portion and the thin film transistor having a CMOS structure of the driving circuit portion in the conventional LCD device will be explained in more detail with reference to FIGS. 3, and 4A to 4H.

FIG. 3 is a flowchart showing a mask process applied to the method for fabricating the switching device of the pixel portion of a top gate structure and the thin film transistor having a CMOS structure of the driving circuit portion in the conventional LCD device. FIGS. 4A to 4H are sectional views respectively showing the fabrication process of the switching device of the pixel portion and the thin film transistor having a CMOS structure of the driving circuit portion in accordance with the conventional art.

Referring to FIG. 3, the conventional method for fabricating a thin film transistor for an LCD device is a first mask process for forming a semiconductor layer on a substrate (S10), a second mask process for forming gate electrodes of a pixel portion and a driving circuit portion on the semiconductor layer (S20), a third mask process for selectively doping n+ impurities at one side of the semiconductor layer of the pixel portion and the driving circuit portion (S30), a fourth mask process for selectively doping p+ impurities at another side of the semiconductor layer of the driving circuit portion (S40), a fifth mask process for forming source/drain contact holes for exposing the semiconductor layer on which the impurities are formed (S50), a sixth mask process for forming source/drain at the source/drain contact holes (S60), a seventh mask process for forming a contact hole on a passivation film formed on an entire surface of the substrate including the source/drain (S70), and an eighth mask process for forming a pixel electrode at the contact hole of the passivation film (S80).

The conventional method for fabricating a thin film transistor for an LCD device by the 8-mask process will be explained in more detail with reference to FIGS. 4A to 4H.

As shown in FIG. 4A, an inorganic insulating material such as $SiO_2$ is deposited on an entire surface of a transparent insulating substrate 20, thereby forming a buffer layer 25. Then, amorphous silicon a-Si is deposited on the entire surface of the substrate 20 on which the buffer layer 25 is formed. The amorphous silicon a-Si is then dehydrogenated, and the dehydrogenated amorphous silicon a-Si is laser-crystallized, thereby crystallizing the amorphous silicon layer into a polysilicon layer.

Then, the poly-silicon layer is patterned by the first mask process S10 thereby to form semiconductor layers 30, 35, and 40.

As shown in FIG. 4B, silicon oxide is deposited on the entire surface of the substrate 20 on which the semiconductor layers 30, 35, and 40 are formed thereby to form a gate insulating layer 45.

Then, a metal material such as Mo is deposited on the gate insulating layer 45 and gate electrodes 50, 55, and 60 are then formed thereon by the second mask process S20. An n– lightly doped drain (LDD) doping is performed on the entire surface of the substrate 20 by ion injection using the gate electrodes 50, 55, and 60 as masks. Semiconductor layers 30a, 35a, and 40a positioned below the gate electrodes 50, 55, and 60 of the pixel portion and the driving circuit portion are not doped, and semiconductor layers 30b, 35b, and 40b are $n^-$-doped.

As shown in FIG. 4C, a photoresist PR is deposited on the entire surface of the $n^-$-doped substrate 20, and a photoresist pattern 62 is formed by the third mask process S30. The PR pattern 62 is formed to shield not only the gate electrodes 50 and 55 of the I and II regions but also an upper portion of the gate insulating layer 45 extending from both sides of the gate electrodes 50 and 55 with a predetermined interval. Also, a PR pattern 63 is formed to completely shield not only the gate electrode 60 but also the gate insulating layer 45 corresponding to the semiconductor layer 40 in the p type thin film transistor portion III of the driving circuit portion.

Then, an n+ doping is performed on the entire surface of the substrate 20 on which the PR patterns 62 and 63 are formed by injecting a high concentration of ions. The semiconductor layer that is not shielded by the PR patterns 62 and 63 is n+ doped thereby to form n-type ohmic contact layers 30c and 35c. The semiconductor layers 30 and 35 of the I and II regions onto which an n– doping and an n+ doping have not been performed by the gate electrodes 50 and 55 form active layers 30a and 35a, and n– doped parts between the active layers 30a and 35a and the ohmic contact layers 30c and 35c form LDD layers 30b and 35b.

As shown in FIG. 4D, a photoresist is deposited on the entire surface of the substrate 20 on which the n-type ohmic contact layers 30c and 35c are formed. Then, a PR pattern 65 for covering not only the gate electrodes 50 and 55 but also the gate insulating layer 45 corresponding to the semiconductor layers 30 and 35 is formed in the pixel portion I and a first device region II of the driving circuit portion by the fourth mask process. Also, the PR pattern is not formed on the gate insulating layer corresponding to the p-type semiconductor layer 40 of the second device region III of the driving circuit portion.

Then, a p+ doping is performed by injecting a high concentration of ions. In the III region, the semiconductor layer 40 onto which the ion-doping has not been performed by the gate electrode 60 forms an active layer 40a, and the p+ doped parts of the semiconductor layer 40 form p-type ohmic contact layers 40c. Then, the PR pattern 65 is removed.

As shown in FIG. 4E, an inorganic insulating material such as SiNx or $SiO_2$ is deposited on the entire surface of the substrate 20 on which the p-type ohmic contact layers 40c are formed, thereby forming an inter-insulating layer 70. Then, the inter-insulating layer 70 and the gate insulating layer 45 are integrally etched by the fifth mask process, thereby forming semiconductor layer contact holes 73a, 73b, 75a, 75b, 77a, and 77b for partially exposing the ohmic contact layers 30c, 35c, and 40c to outside.

As shown in FIG. 4F, Mo and AlNd are sequentially deposited on the inter-insulating layer 70 on which the semiconductor layer contact holes 73a, 73b, 75a, 75b, 77a, and 77b are formed, and then are integrally etched by the sixth mask process, thereby forming source and drain electrodes 80a, 83a, 87a, 80b, 83b, and 87b connected to the ohmic contact layers 30c, 35c, and 40c through the semiconductor layer contact holes 73a, 73b, 75a, 75b, 77a, and 77b.

As shown in FIG. 4G, a silicon nitride SiNx is deposited on the substrate 20 on which the source and drain electrodes 80a, 83a, 87a, 80b, 83b, and 87b are formed, and then is thermally-hydrogenated. Then, a passivation film 90 having a drain contact hole 95 is formed on the substrate 20 by the seventh mask process.

Even if the subsequent steps belong to the process for fabricating an array substrate, the steps will be briefly explained since the subsequent steps relate to the process for fabricating a thin film transistor.

As shown in FIG. 4H, an indium tin oxide (ITO) is deposited on the entire surface of the substrate on which the passivation film 90 is formed. Then, a pixel electrode 97 connected to a drain electrode 90b through the drain contact hole 95 is formed by the eight mask process.

As aforementioned, in the conventional switching device of the LCD device having an integral driving circuit therein and the fabrication method thereof, mask processes are performed 8 times. Since the mask process includes photo-resist coating, exposure, and development, the fabrication cost and the processing time are increased as the number of the mask processes is increased. As the result, the price competitiveness is degraded and the production yield is degraded. In addition, as the number of the mask processes is increased, the generation of defects in the thin film transistor is increased. Further, in fabricating the thin film transistor of a top-gate structure, an n+ doped ohmic contact layer may be lost by an over-etching when forming the semiconductor layer contact hole.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
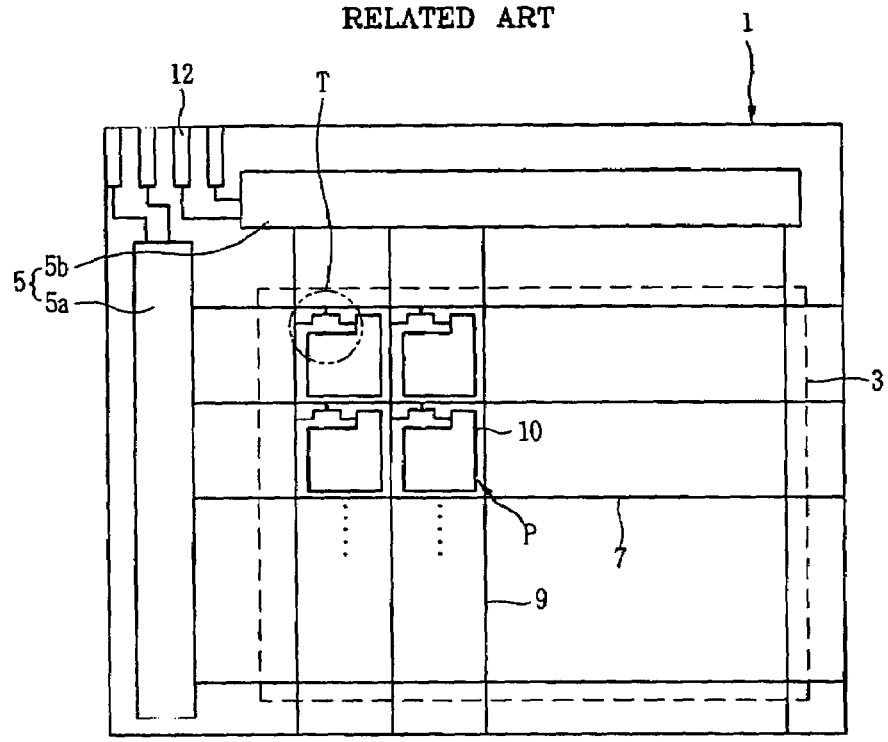
FIG. 1 is a schematic view showing an LCD device having an integrated driving circuit portion in accordance with the conventional art.
Figure 2:
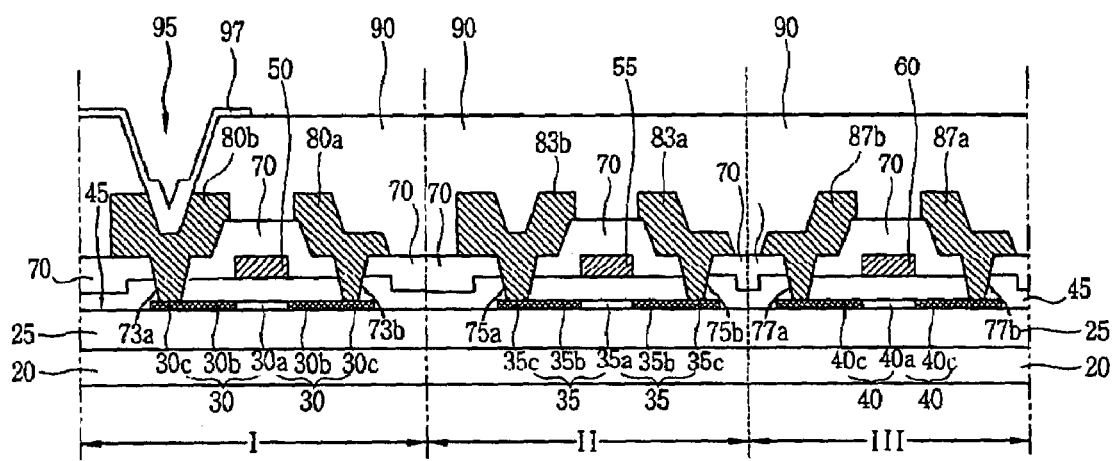
FIG. 2 is a sectional view showing a switching device of a pixel portion and a thin film transistor having a CMOS structure of a driving circuit portion in accordance with the conventional art.
Figure 3:
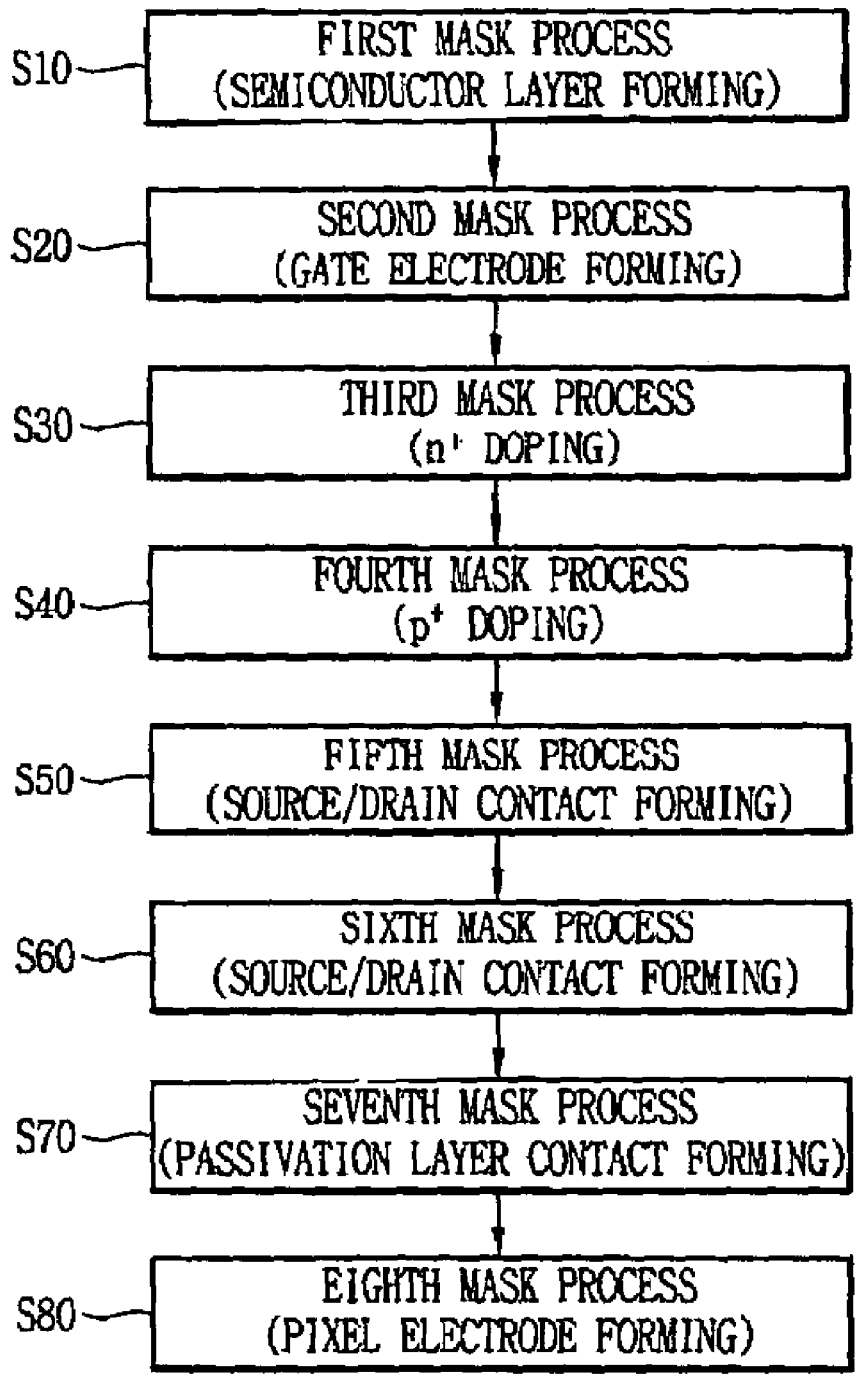
FIG. 3 is a flowchart of a mask process applied to a method for fabricating the switching device of a pixel portion having a top gate structure and the thin film transistor having a CMOS structure of a driving circuit portion in accordance with the conventional art.
Figure 4A:
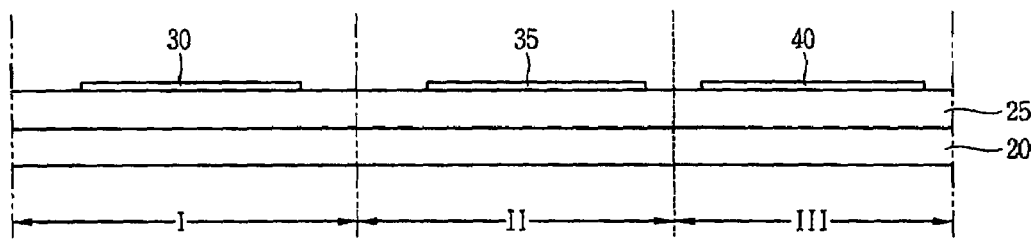
FIGS. 4A to 4H are sectional views respectively showing a process for fabricating the switching device of a pixel portion and the thin film transistor having a CMOS structure of a driving circuit portion in accordance with the conventional art.
Figure 4B:
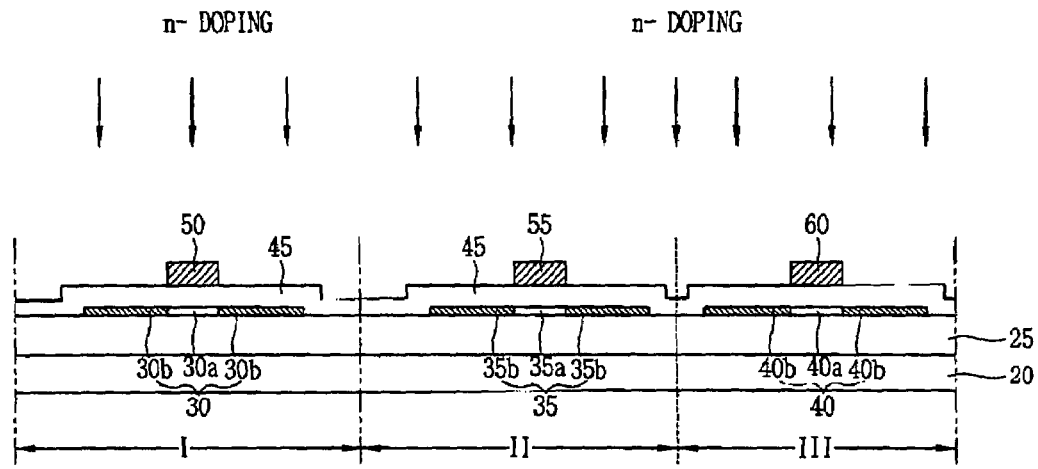
Figure 4C:
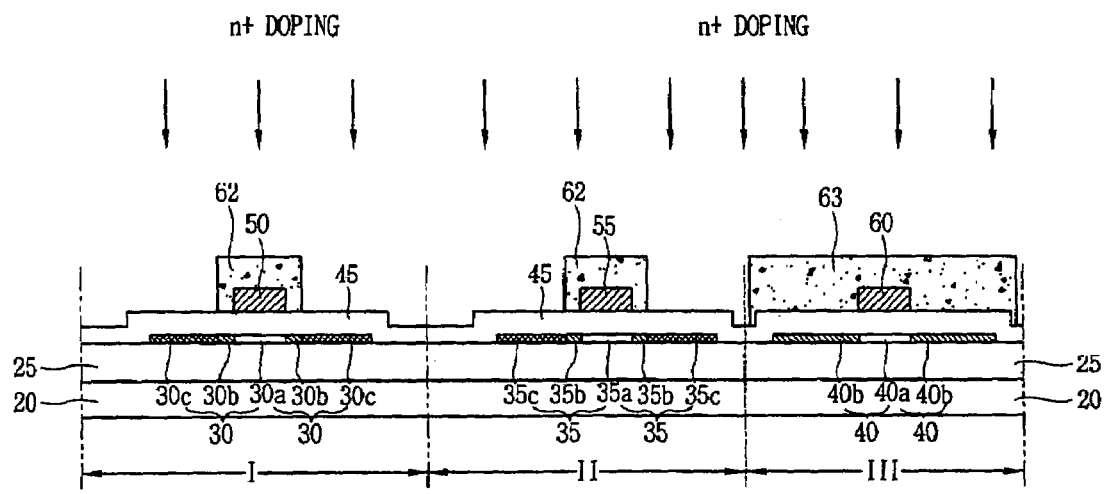
Figure 4D:
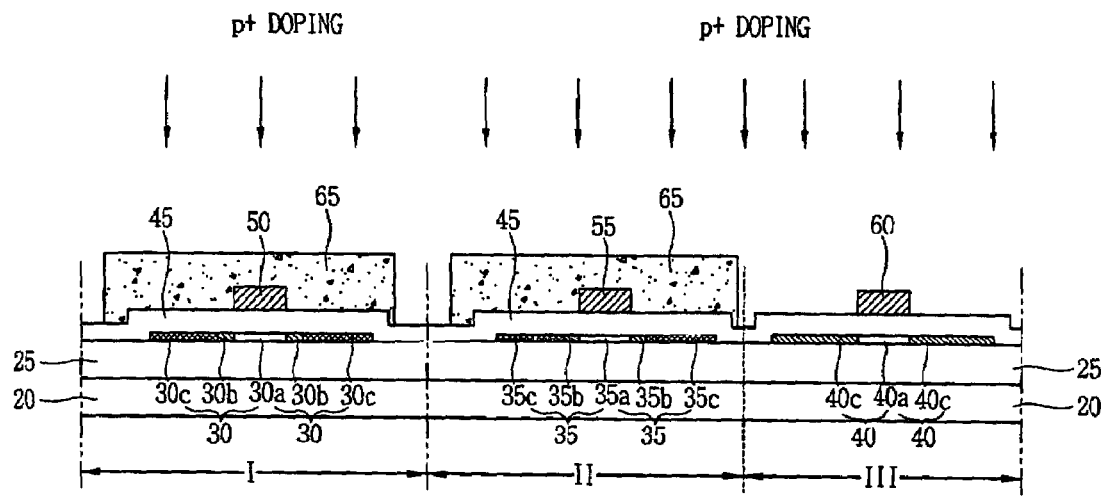
Figure 4E:
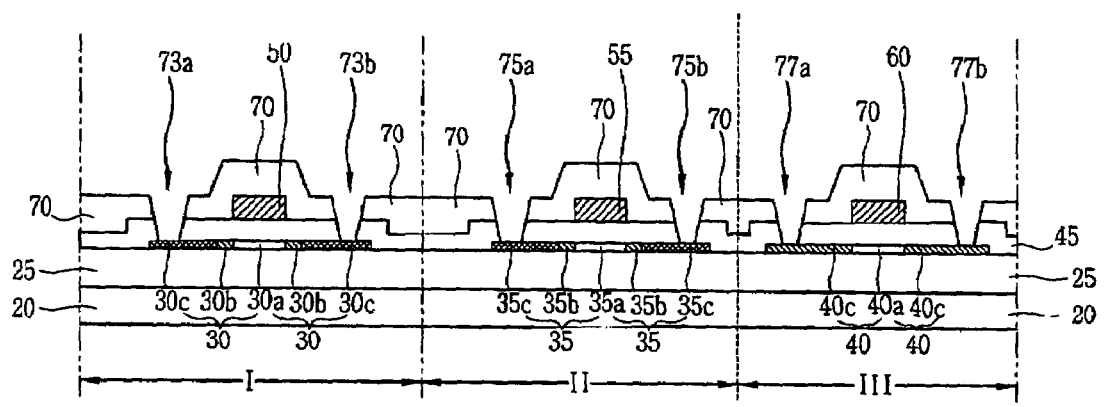
Figure 4F:
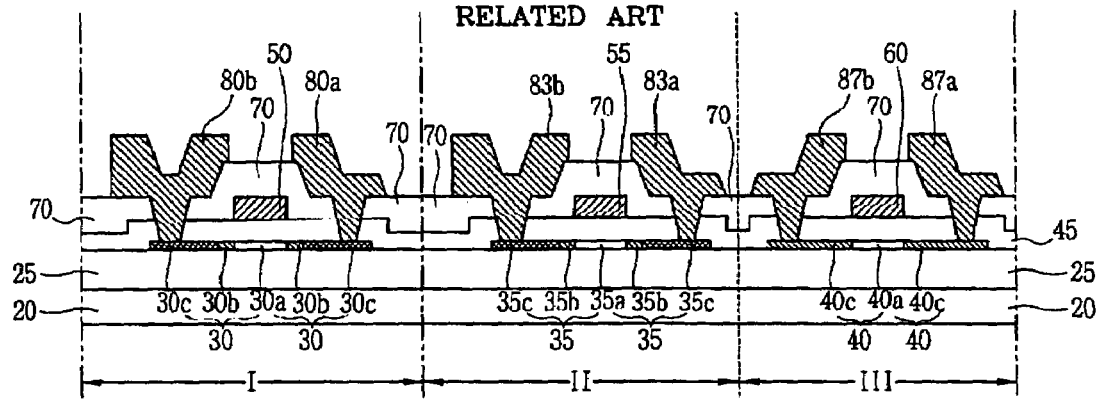
Figure 4G:
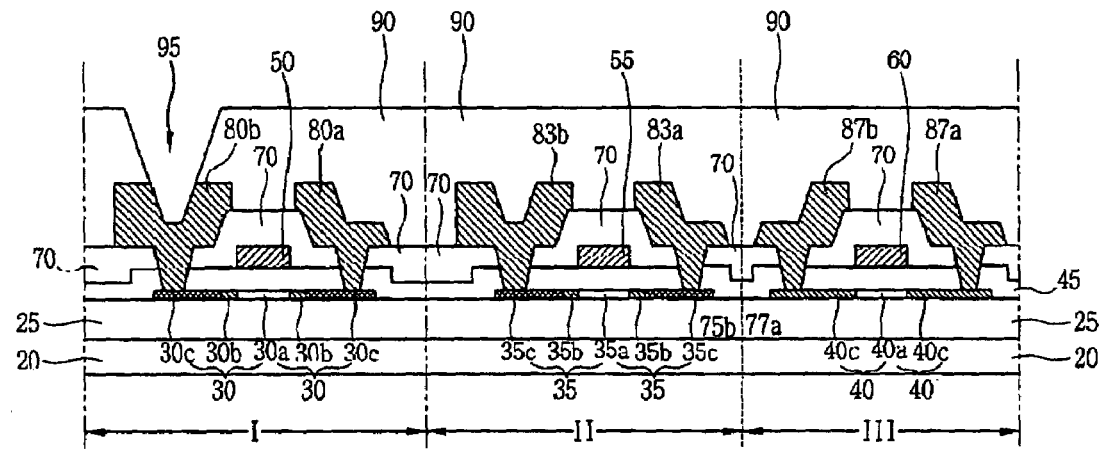
Figure 4H:
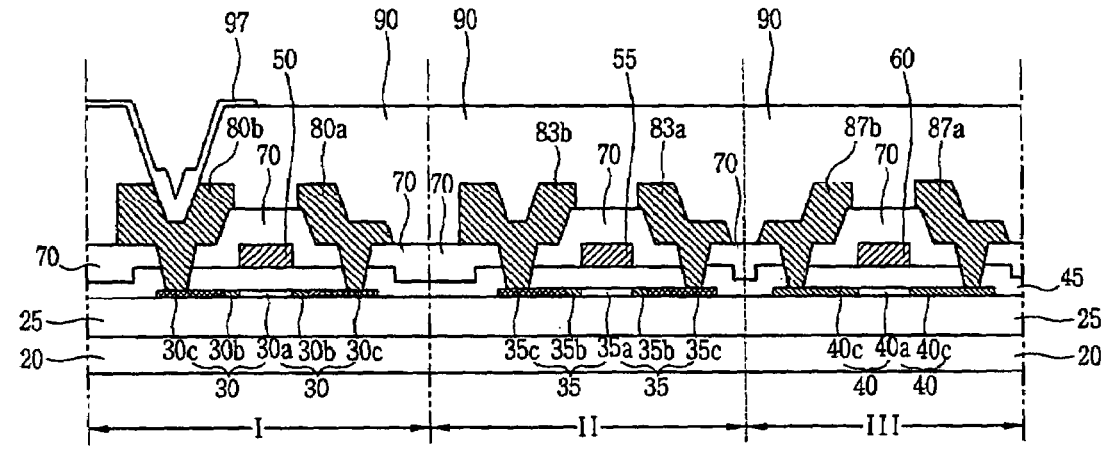
Figure 5:
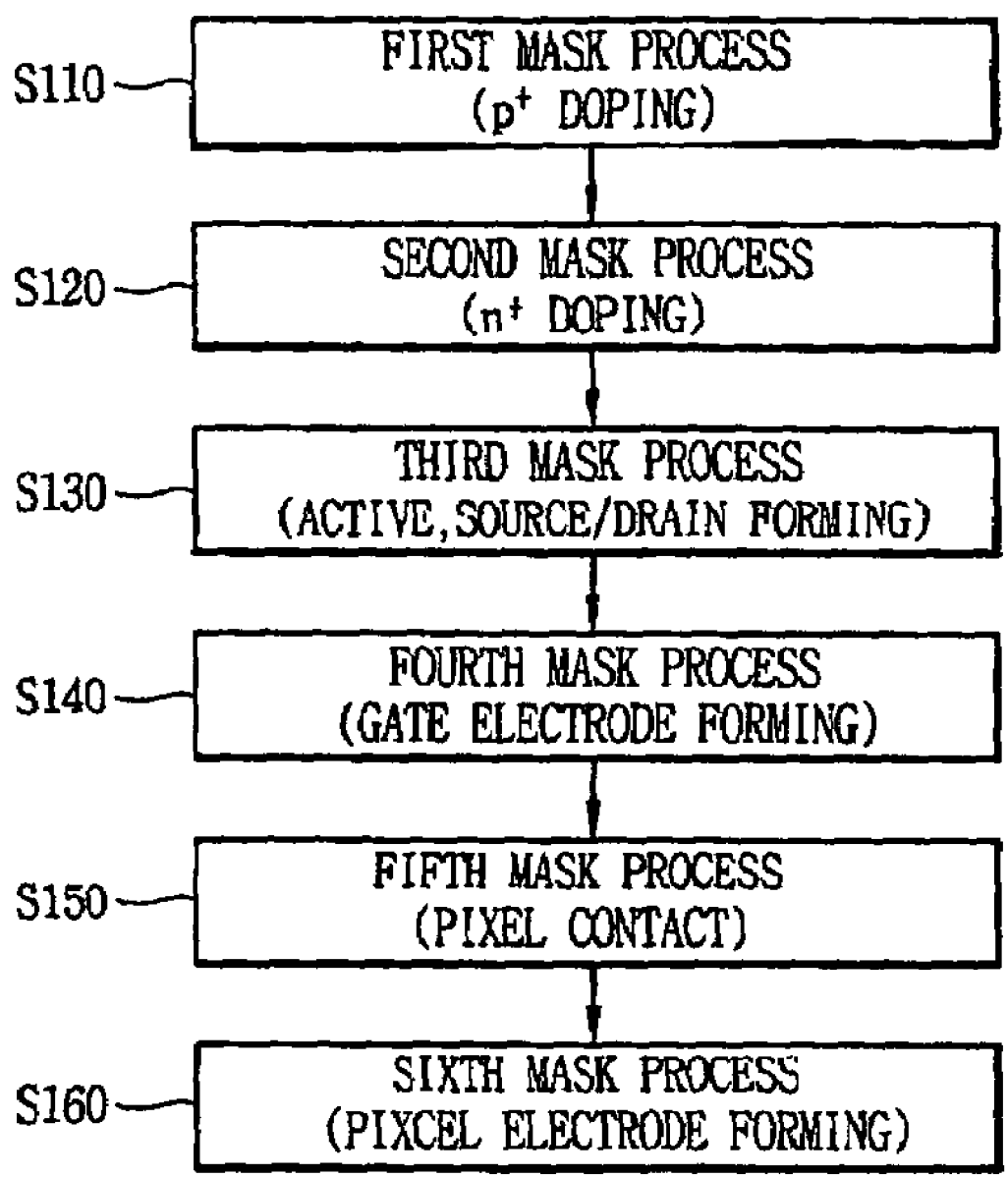
FIG. 5 is a flowchart of a mask process applied to a method for fabricating a switching device of a pixel portion having a top gate structure and a thin film transistor having a CMOS structure of a driving circuit portion according to the present invention.

FIG. 5 is a flowchart of a mask process applied to a method for fabricating a switching device of a pixel portion having a top gate structure and a thin film transistor having a CMOS structure of a driving circuit portion according to the present invention, and FIGS. 6A to 6K are sectional views respectively showing a process for fabricating a switching device of a pixel portion and a thin film transistor having a CMOS structure of a driving circuit portion according to the present invention.

Referring to FIG. 5, a method for fabricating a thin film transistor for an LCD device according to the present invention comprises a first mask process for doping p+impurities on a semiconductor layer of a pixel portion I and on a part of a semiconductor layer of a second device region III of a driving circuit portion (S110), a second mask process for doping n+ impurities at a part of the semiconductor layer of the first device region II of the driving circuit portion (S120), a third mask process for patterning source/drain regions and an active region by using a diffraction exposure (S130), a fourth mask process for forming a gate electrode (S140), a fifth mask process for forming pixel electrode contact holes (S150), and a sixth mask process for forming pixel electrodes connected to the drain regions through the pixel electrode contact holes (S1160).

A method for fabricating a thin film transistor constituting a pixel portion and a driving circuit portion for the LCD device fabricated by the six-mask process will be explained with reference to FIGS. 6A to 6K.

Figure 6A:
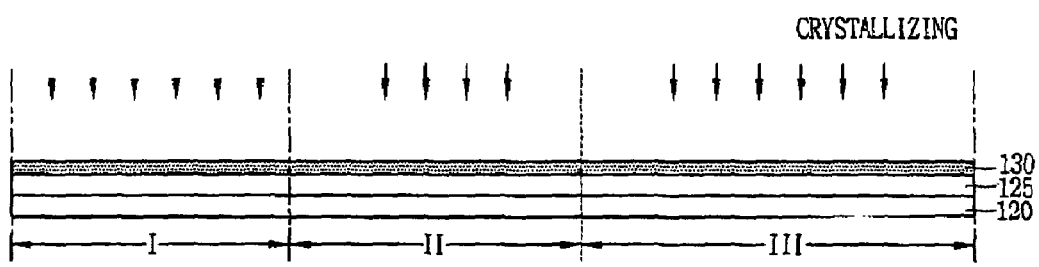
FIGS. 6A to 6K are sectional views respectively showing a process for fabricating a switching device of a pixel portion and a thin film transistor having a CMOS structure of a driving circuit portion according to a first embodiment of the present invention.

As shown in FIG. 6A, an inorganic insulator such as SiO₂ is deposited on an entire surface of a transparent insulating substrate 120, thereby forming a buffer layer 125. Amorphous silicon a-Si is deposited on the entire surface of the substrate 120 on which the buffer layer 125 is formed. The amorphous silicon a-Si is dehydrogenated, and then the dehydrogenated amorphous silicon a-Si is laser-crystallized, thereby crystallizing the amorphous silicon layer into a poly-silicon layer 130.

Figure 6B:
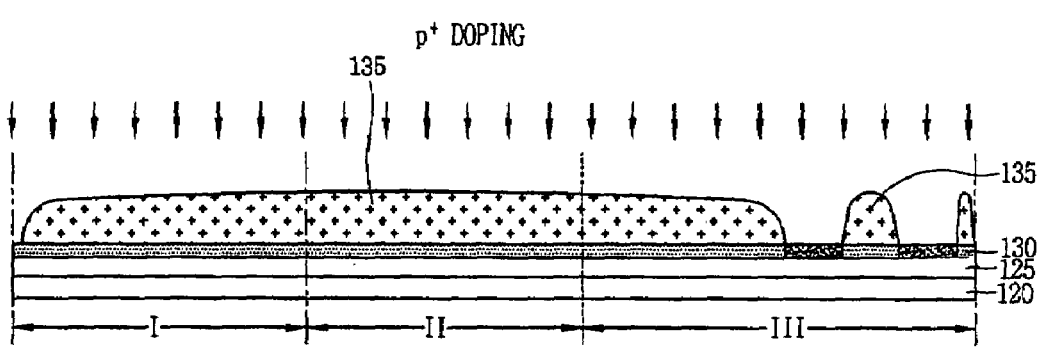

As shown in FIG. 6B, a first photoresist is deposited on the poly-silicon layer 130, and then is selectively patterned by the first mask process S110, thereby forming a first photoresist patterns 135 for exposing a part of the poly-silicon layer 130. At the time of the first mask process S110, the first photoresist pattern 135 remains on the entire first thin film transistor region I of the pixel portion, the entire second thin film transistor region II of the driving circuit portion, and a gate forming region of the third thin film transistor region III of the driving circuit portion.

Then, the poly-silicon layer 130 of the p-type third thin film transistor region III of the driving circuit portion is doped with p+ impurities using the first photoresist pattern 135 as a mask. The first photoresist pattern 135 is then removed.

Figure 6C:
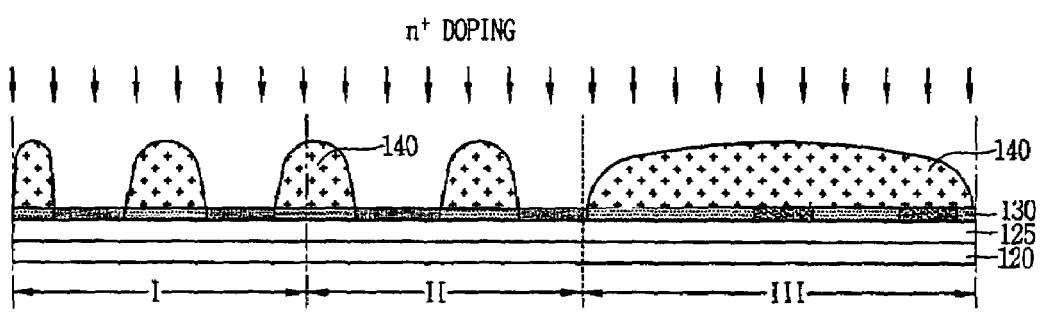

As shown in FIG. 6C, a second photoresist is deposited on the poly-silicon layer 130. The second photoresist is then patterned by the second mask process S120, thereby forming a second photoresist pattern 140 for exposing a part of the poly-silicon layer 130. The second photoresist pattern 140 shields the entire p-type third thin film transistor region III of the driving circuit portion, and only gate electrode forming regions of the first thin film transistor region I of the pixel portion and the n-type second thin film transistor region II of the driving circuit portion.

Then, the poly-silicon layer 130 is doped with n+ impurities using the second photoresist pattern 140 as a mask.

Figure 6D:
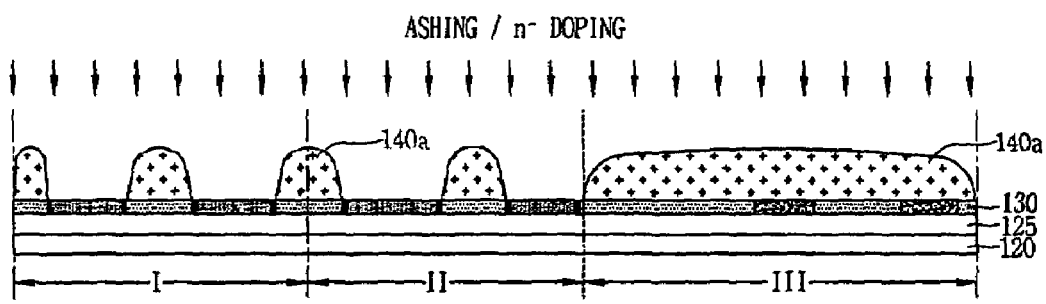

As shown in FIG. 6D, the second photoresist pattern 140 is etched by a set thickness using an ashing process, and the poly-silicon layer 130 is doped with n⁻ impurities in order to form an LDD region. The ashed second photoresist pattern 140 is then removed.

Figure 6E:
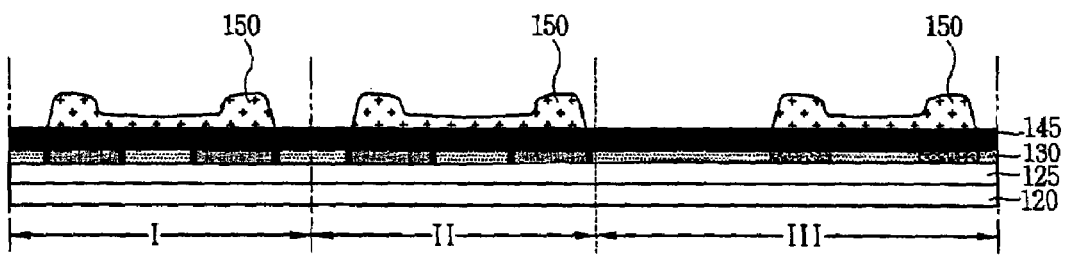

As shown in FIG. 6E, a source/drain conductive layer 145 is deposited on the entire surface of the substrate after the impurity doping process.

Then, a third photoresist is deposited on the conductive layer 145. The third photoresist is partially etched by the third mask process S130 using a diffraction pattern mask in order to define an activate region and source/drain regions, thereby forming a third photoresist pattern 150. When the third photoresist is exposed using the diffraction pattern mask, the diffraction-exposed third photoresist is not completely exposed but is developed only a predetermined thickness thereof in the subsequent developing process. That is, the diffraction-exposed third photoresist is not completely exposed but is partially exposed since the light transmittance rate thereof is smaller than that of a fully exposed photoresist.

Accordingly, when the diffraction-exposed third photoresist is developed, approximately a predetermined thickness is developed when compared with a non-exposed photoresist as shown in FIG. 6E. That is, channel regions of the first, second and third devices are exposed more than the source and drain regions during the diffraction exposure.

Figure 6F:
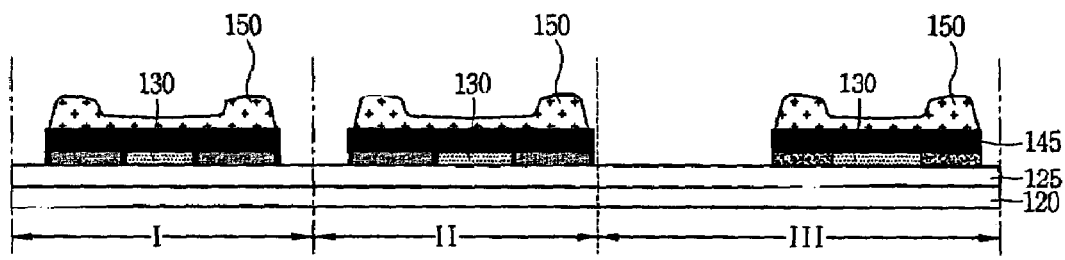

As shown in FIG. 6F, the conductive layer 145 and the poly-silicon layer 130 are selectively etched using the third photoresist pattern 150 as a mask, thereby defining source/drain regions and an activate region.

Figure 6G:
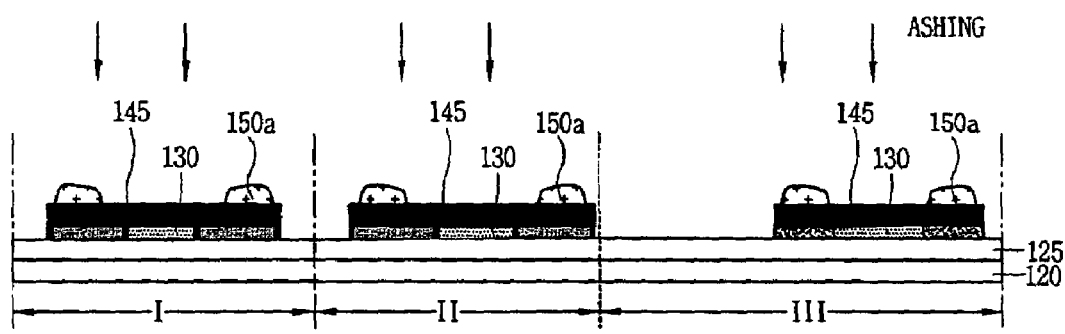

As shown in FIG. 6G, a set thickness of the third photoresist pattern 150 is removed using an ashing process, thereby exposing an upper middle portion of the conductive layer 145.

Figure 6H:
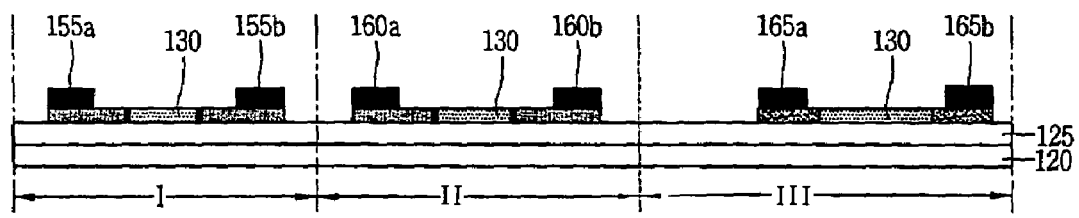

As shown in FIG. 6H, the conductive layer 145 is selectively removed using the ashed third photoresist pattern 150a as a mask, thereby forming a first source/drain 155a and 155b of the pixel portion, a second source/drain 160a and 160b of the driving circuit portion, and a third source/drain 165a and 165b of the driving circuit portion. Then, the ashed third photoresist 150a is removed.

Figure 6I:
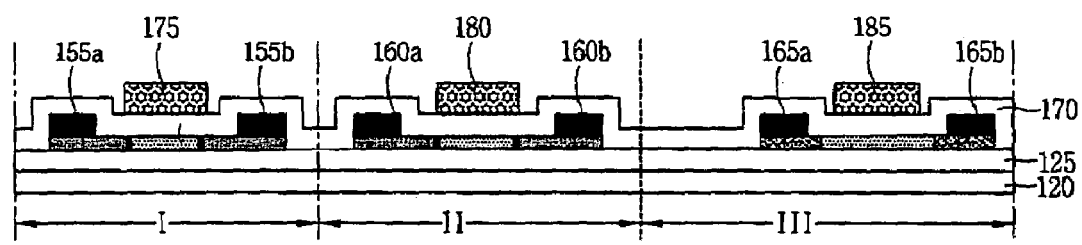

As shown in FIG. 6I, silicon oxide SiO₂ for example is deposited on an entire surface of the substrate including the first source/drain 155a and 155b of the pixel portion, the second source/drain 160a and 160b of the driving circuit portion, and the third source/drain 165a and 165b of the driving circuit portion, thereby forming a gate insulating layer 170. The gate insulating layer 170 is then activated. A conductive material such as Mo, Al, AlNd, Cr, Cu, or W is deposited on the gate insulating layer 137, and a fourth photoresist is deposited on the conductive material. The fourth photoresist is selectively removed by the fourth mask process S140 to form a fourth photoresist pattern (not shown) for defining a gate electrode.

As shown in FIG. 6I, the conductive material is patterned using the fourth photoresist pattern (not shown) as a mask thereby to form gate electrodes 175, 180, and 185. Then, the fourth photoresist pattern (not shown) is removed.

Figure 6J:
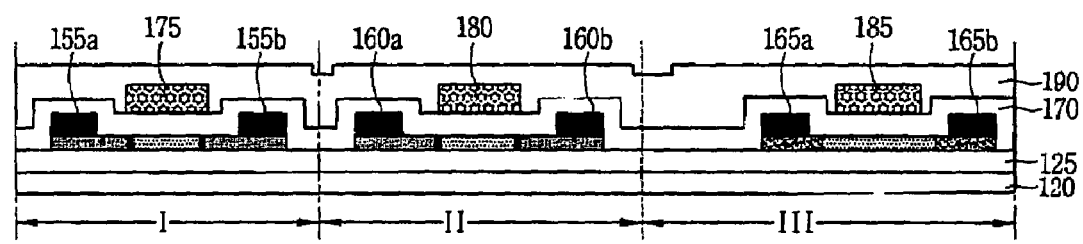

As shown in FIG. 6J, an insulator is deposited on the entire surface of the substrate including the gate electrodes 175, 180, and 185 thereby forming a passivation film 190. The insulator may comprise one or more inorganic materials such as silicon oxide (SiO2) or silicon nitride (SiNx) and/or one or more organic materials such as Benzocyclobutene and Acryl resin. The passivation film 190 is then thermally-hydrogenated.

A fifth photoresist is subsequently deposited on the passivation film 190 and the fifth photoresist is selectively removed by the fifth mask process S150, thereby forming a fifth photoresist pattern (not shown) defining a contact hole for connecting the drain electrode to the pixel electrode.

Figure 6K:
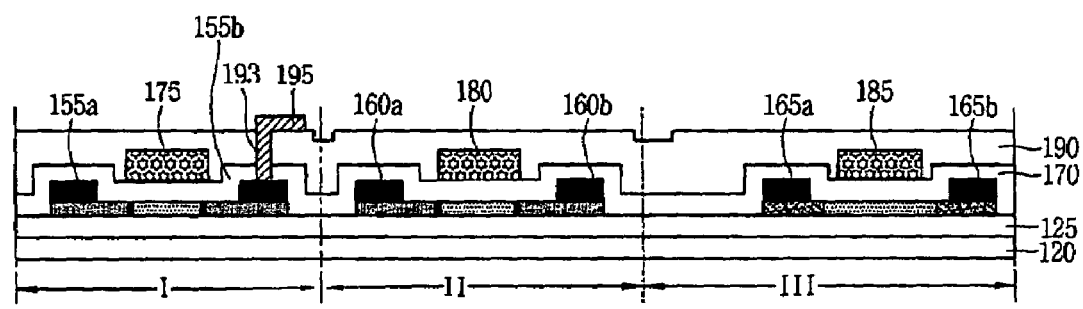

As shown in FIG. 6K, the passivation film 190 and the gate insulating layer 170 below the passivation film 190 are selectively removed using the fifth photoresist pattern (not shown) as a mask, thereby forming a passivation film contact hole 193 exposing the drain 155b of the pixel portion. The fifth photoresist pattern (not shown) is then removed.

A transparent conductive material such as indium tin oxide (ITO) or indium zinc oxide (IZO) is next deposited on the entire surface of the substrate on which the passivation film 170 is formed. A sixth photoresist is deposited on the ITO layer and the photoresist is patterned by the sixth mask process S160, thereby forming a sixth photoresist pattern (not shown). The ITO layer is selectively removed by using the sixth photoresist pattern (not shown) as a mask, thereby forming a pixel electrode 195 connected to the drain 155b. After this, the sixth photoresist pattern (not shown) is removed.

FIGS. 7A to 7K are sectional views respectively showing a process for fabricating a switching device of a pixel portion and a thin film transistor having a CMOS structure of a driving circuit portion according to another embodiment of the present invention.

Figure 7A:
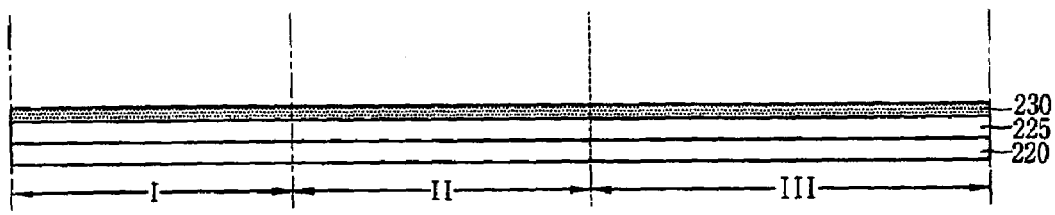
FIGS. 7A to 7K are sectional views respectively showing a process for fabricating a switching device of a pixel portion and a thin film transistor having a CMOS structure of a driving circuit portion according to another embodiment of the present invention.

As shown in FIG. 7A, an inorganic insulator such as SiO₂ is deposited on an entire surface of a transparent insulating substrate 220, thereby forming a buffer layer 225. Amorphous silicon a-Si is deposited on the entire surface of the substrate 220 on which the buffer layer 225 is formed, and the amorphous silicon a-Si is the dehydrogenated. As opposed to the aforementioned embodiment, laser-crystallization of the amorphous silicon is not performed immediately after the dehydrogenation process.

Figure 7B:
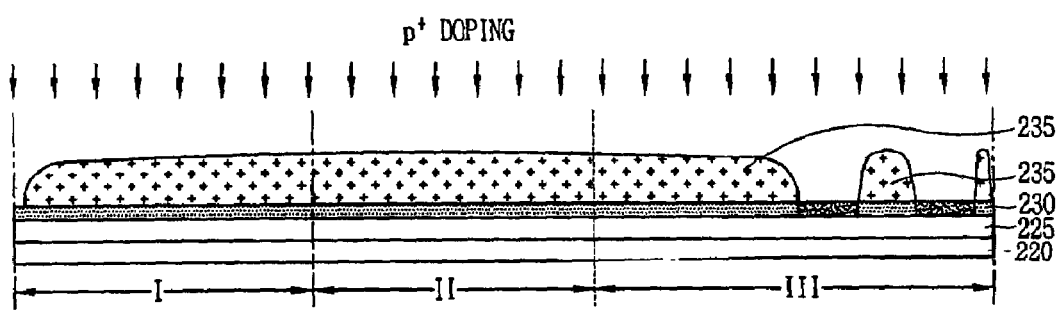

As shown in FIG. 7B, a first photoresist is deposited on the amorphous silicon layer 230, and then the first photoresist is selectively patterned by the first mask process S110, thereby forming a first photoresist pattern 235 exposing a part of the amorphous-silicon layer 230. At the time of the first mask process S110, the first photoresist pattern 235 remains on the entire first thin film transistor region I of the pixel portion, the entire second thin film transistor region II of the driving circuit portion, and a gate forming region of the third thin film transistor region III of the driving circuit portion.

The amorphous-silicon layer 230 of the p-type third thin film transistor region III of the driving circuit portion is doped with p+ impurities using the first photoresist pattern 235 as a mask. The first photoresist pattern 235 is subsequently removed.

Figure 7C:
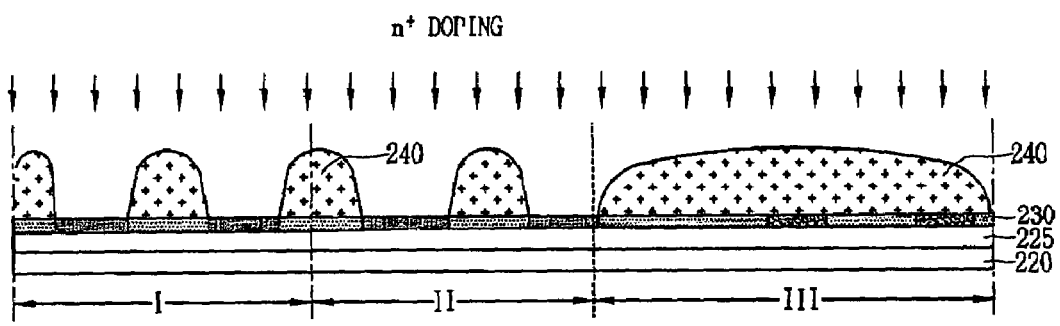

As shown in FIG. 7C, a second photoresist is deposited on the amorphous-silicon layer 230, and the second photoresist is patterned by the second mask process S120, thereby forming a second photoresist pattern 240 exposing a part of the amorphous-silicon layer 230. The second photoresist pattern 240 shields the entire p-type third thin film transistor region III of the driving circuit portion, and only gate electrode forming regions of the first thin film transistor region I of the pixel portion and the n-type second thin film transistor region II of the driving circuit portion. The amorphous-silicon layer 230 is doped with n+ impurities using the second photoresist pattern 240 as a mask.

Figure 7D:
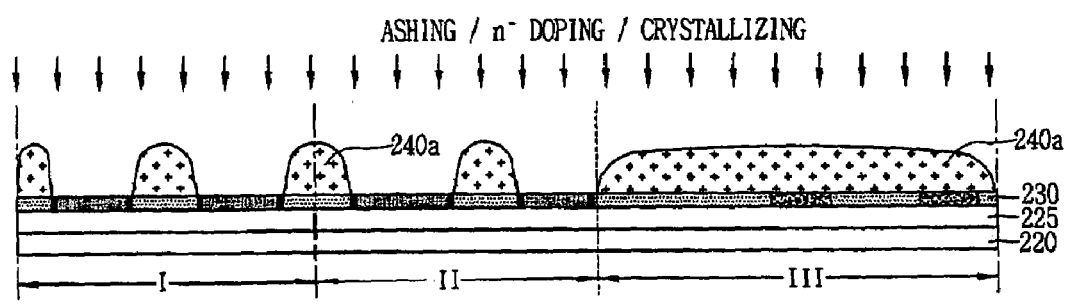

As shown in FIG. 7D, the second photoresist pattern 240 is etched by a predetermined thickness using an ashing process, and the amorphous-silicon layer 230 is doped with n− impurities in order to form an LDD region. The ashed second photoresist pattern 240a is removed, and a laser-crystallization process is performed to crystallize the amorphous silicon layer 230 into a poly-silicon layer.

Figure 7E:
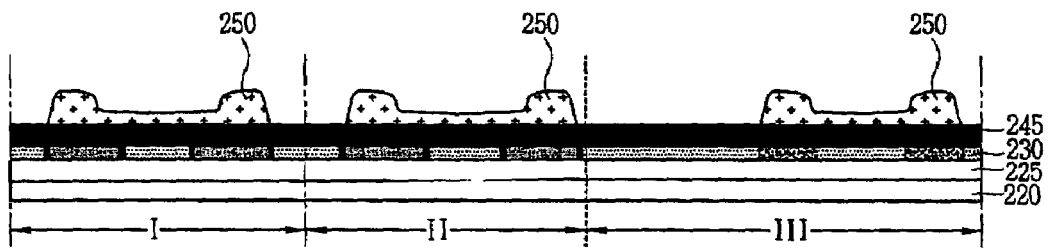

As shown in FIG. 7E, a source/drain conductive layer 245 is deposited on the entire surface of the substrate after the impurity doping process. A third photoresist is then deposited on the conductive layer 245, and is partially etched by the third mask process S130 using a diffraction pattern mask in order to define an activate region and source/drain regions, thereby forming a third photoresist pattern 250. When the third photoresist is exposed using the diffraction pattern mask, the diffraction-exposed third photoresist is not completely exposed but is developed only a predetermined thickness thereof in the subsequent developing process. That is, the diffraction-exposed third photoresist is not completely exposed but is partially exposed since the light transmittance rate thereof is smaller than that of a fully exposed photoresist. Accordingly, when the diffraction-exposed third photoresist is developed, approximately a predetermined thereof is developed when compared with a non-exposed photoresist as shown in FIG. 7E. That is, channel regions of the first, second, and third devices are exposed more than the source and drain regions during the diffraction exposure.

Figure 7F:
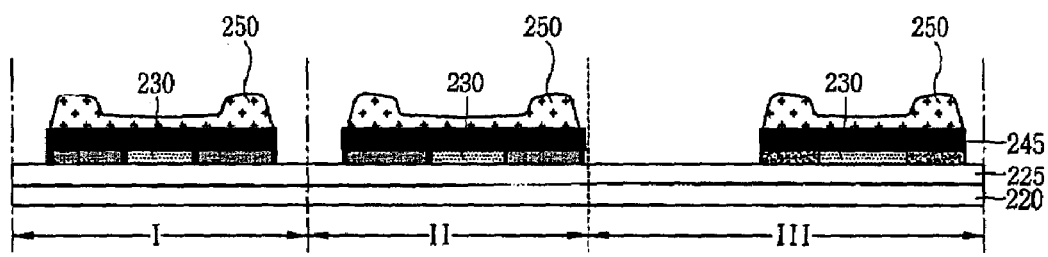

As shown in FIG. 7F, the conductive layer 245 and the poly-silicon layer 230 are selectively etched using the third photoresist pattern 250 as a mask, thereby defining source/drain regions and an activate region.

Figure 7G:
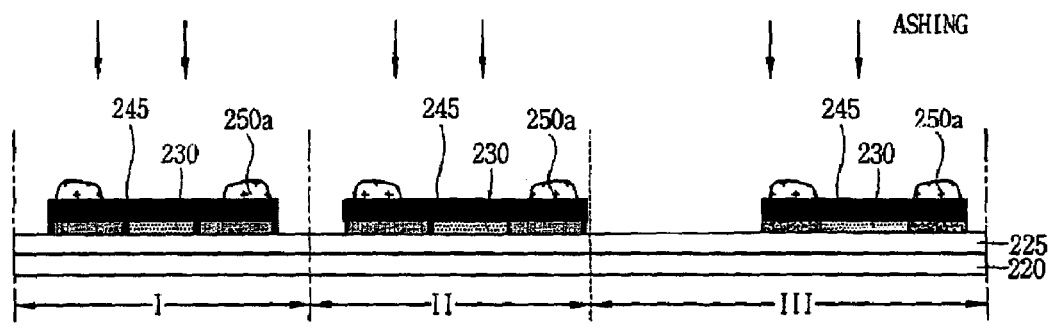

As shown in FIG. 7G, a predetermined thickness of the third photoresist pattern 250 is removed by an ashing process, thereby exposing an upper middle portion of the conductive layer 245.

Figure 7H:
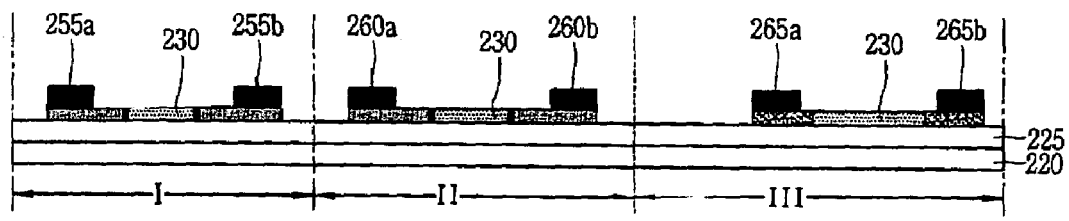

As shown in FIG. 7H, the conductive layer 245 is selectively removed using the third photoresist pattern 250 as a mask, thereby forming a first source/drain 255a and 255b of the pixel portion, a second source/drain 260a and 260b of the driving circuit portion, and a third source/drain 265a and 265b of the driving circuit portion. Then, the third photoresist 250 is removed.

Figure 7I:
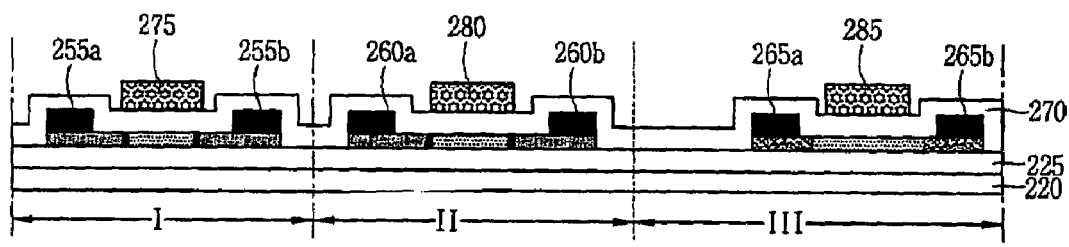

As shown in FIG. 7I, an insulating layer such as silicon oxide $SiO_2$ is deposited on an entire surface of the substrate including the first source/drain 255a and 255b of the pixel portion, the second source/drain 260a and 260b of the driving circuit portion, and the third source/drain 265a and 265b of the driving circuit portion, thereby forming a gate insulating layer 270. Unlike the previous embodiment, a process for activating the gate insulating layer 270 after forming the gate insulating layer is not performed.

Then, a conductive material such as Mo, Al, AlNd, Cr, Cu, or W is deposited on the gate insulating layer 270 and a fourth photoresist is deposited on the conductive material. The fourth photoresist is selectively removed by the fourth mask process S140 thereby forming a fourth photoresist pattern (not shown) for defining a gate electrode.

As shown in FIG. 7I, the conductive material is patterned using the fourth photoresist pattern (not shown) as a mask thereby to form gate electrodes 275, 280, and 285. Then, the fourth photoresist pattern (not shown) is removed.

Figure 7J:
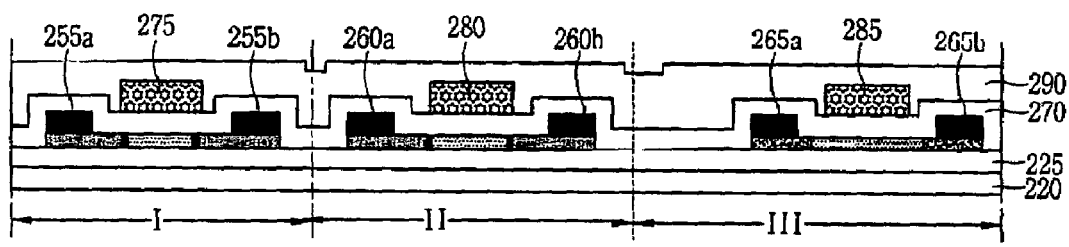

As shown in FIG. 7J, an insulator is deposited on the entire surface of the substrate including the gate electrodes 275, 280, and 285 thereby to form a passivation film 290. The insulator may comprise one or more inorganic materials such as silicon oxide ($SiO_2$) or silicon nitride ($SiN_x$) and/or one or more organic materials such as Benzocyclobutene and Acryl resin. Then, the passivation film 290 is thermally-hydrogenated.

A fifth photoresist is deposited on the passivation film 290 and then the fifth photoresist is selectively removed by the fifth mask process S150, thereby forming a fifth photoresist pattern (not shown) defining a contact hole for connecting a drain electrode to a pixel electrode.

Figure 7K:
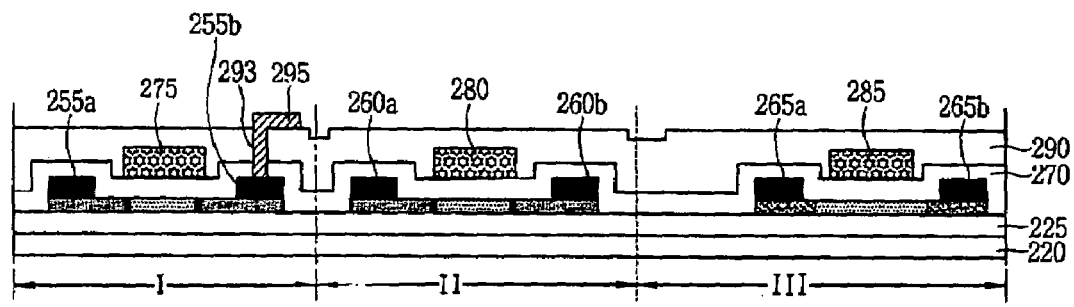

As shown in FIG. 7K, the passivation film 290 and the gate insulating layer 270 below the passivation film 290 are selectively removed using the fifth photoresist pattern (not shown) as a mask, thereby forming a passivation film contact hole 293 exposing the drain 255b of the pixel portion. Then, the fifth photoresist pattern (not shown) is removed.

A transparent conductive material such as indium tin oxide (ITO) or indium zinc oxide (IZO) is deposited on the passivation film 290 where the passivation film contact hole 293 is formed. A sixth photoresist is deposited on the ITO layer and the photoresist is patterned by the sixth mask process S160, thereby forming a sixth photoresist pattern (not shown). The ITO layer is selectively removed using the sixth photoresist pattern (not shown) as a mask to thereby form a pixel electrode 295 connected to the drain 255b. The sixth photoresist pattern (not shown) is then removed.

FIGS. 8A to 8K are sectional views respectively showing a process for fabricating a switching device of a pixel portion and a thin film transistor having a CMOS structure of a driving circuit portion according to another embodiment of the present invention.

Figure 8A:
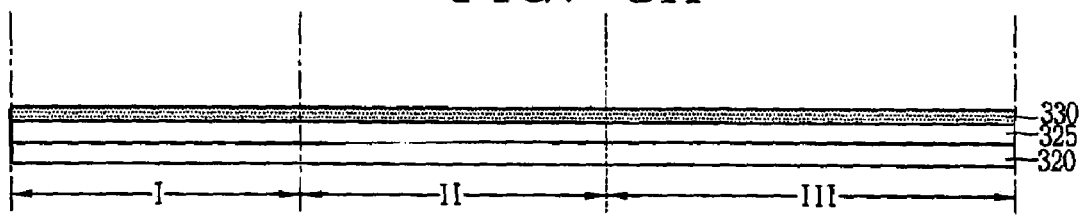
FIGS. 8A to 8K are sectional views respectively showing a process for fabricating a switching device of a pixel portion and a thin film transistor having a CMOS structure of a driving circuit portion according to another embodiment of the present invention.

As shown in FIG. 8A, an inorganic insulator such as $SiO_2$ is deposited on an entire surface of a transparent insulating substrate 320, thereby forming a buffer layer 325. Amorphous silicon a-Si is deposited on the entire surface of the substrate 320 on which the buffer layer 325 is formed, and the amorphous silicon a-Si is the dehydrogenated. Laser-crystallization of the amorphous silicon is not performed immediately after the dehydrogenation process.

Figure 8B:
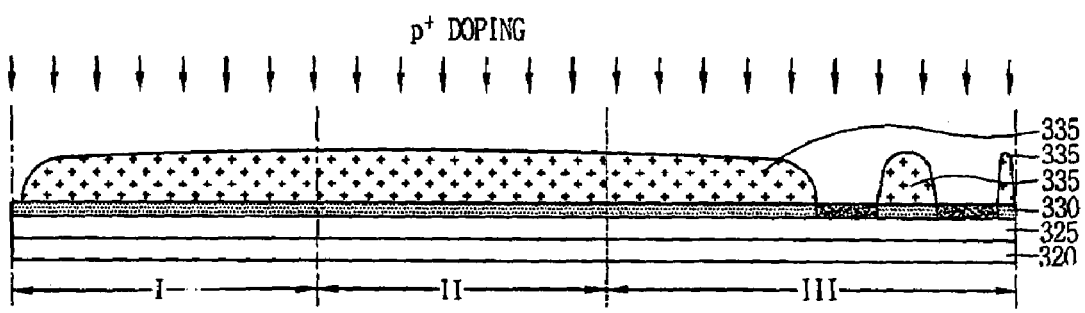

As shown in FIG. 8B, a first photoresist is deposited on the amorphous silicon layer 330, and then the first photoresist is selectively patterned by the first mask process S110, thereby forming a first photoresist pattern 335 exposing a part of the amorphous-silicon layer 330. At the time of the first mask process S110, the first photoresist pattern 335 remains on the entire first thin film transistor region I of the pixel portion, the entire second thin film transistor region II of the driving circuit portion, and a gate forming region of the third thin film transistor region III of the driving circuit portion.

The amorphous-silicon layer 330 of the p-type third thin film transistor region III of the driving circuit portion is doped with p+ impurities using the first photoresist pattern 335 as a mask. The first photoresist pattern 335 is subsequently removed.

Figure 8C:
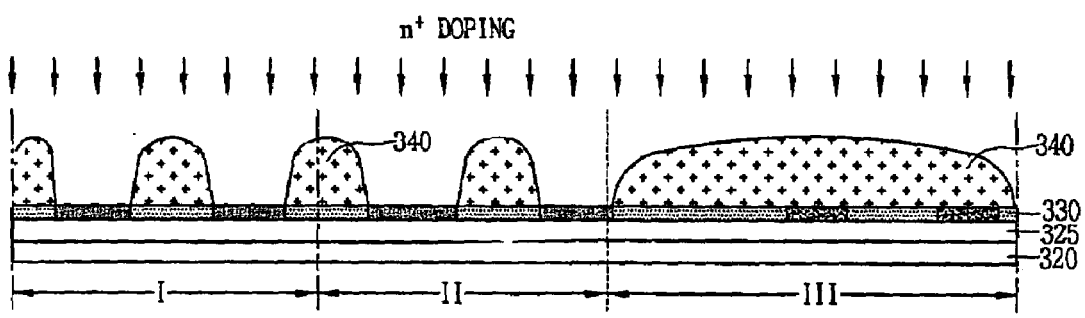

As shown in FIG. 8C, a second photoresist is deposited on the amorphous-silicon layer 330, and the second photoresist is patterned by the second mask process S120, thereby forming a second photoresist pattern 340 exposing a part of the amorphous-silicon layer 330. The second photoresist pattern 340 shields the entire p-type third thin film transistor region III of the driving circuit portion, and only gate electrode forming regions of the first thin film transistor region I of the pixel portion and the n-type second thin film transistor region II of the driving circuit portion. The amorphous-silicon layer 330 is doped with n+ impurities using the second photoresist pattern 340 as a mask.

Figure 8D:
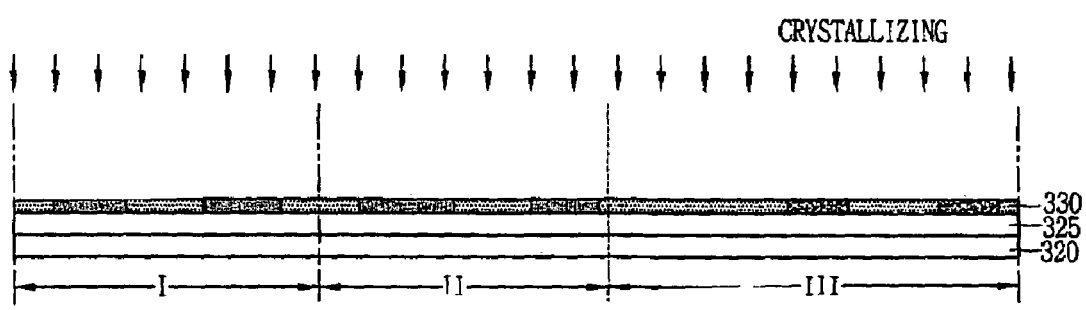

As shown in FIG. 8D, the second photoresist pattern 340 is removed, and a laser-crystallization process is performed to crystallize the amorphous silicon layer 330 into a poly-silicon layer.

Figure 8E:
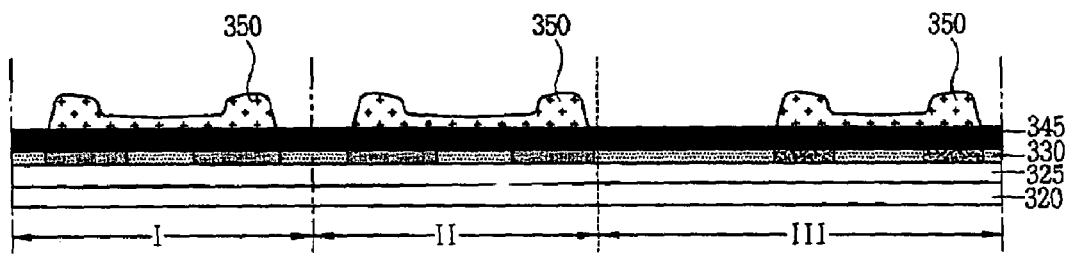

As shown in FIG. 8E, a source/drain conductive layer 345 is deposited on the entire surface of the substrate after the laser-crystallization process. A third photoresist is then deposited on the conductive layer 345, and is partially etched by the third mask process S130 using a diffraction pattern mask in order to define an activate region and source/drain regions, thereby forming a third photoresist pattern 350. When the third photoresist is exposed using the diffraction pattern mask, the diffraction-exposed third photoresist is not completely exposed but is developed only a predetermined thickness thereof in the subsequent developing process. That is, the diffraction-exposed third photoresist is not completely exposed but is partially exposed since the light transmittance rate thereof is smaller than that of a fully exposed photoresist. Accordingly, when the diffraction-exposed third photoresist is developed, approximately a predetermined thereof is developed when compared with a non-exposed photoresist as shown in FIG. 8E. That is, channel regions of the first, second, and third devices are exposed more than the source and drain regions during the diffraction exposure.

Figure 8F:
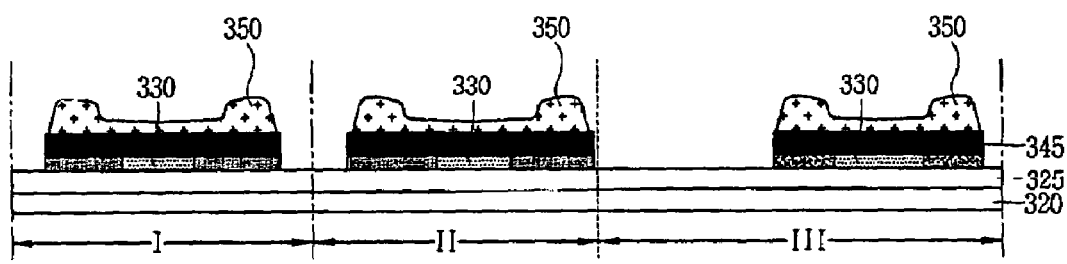

As shown in FIG. 8F, the conductive layer 345 and the poly-silicon layer 330a are selectively etched using the third photoresist pattern 350 as a mask, thereby defining source/drain regions and an activate region.

Figure 8G:
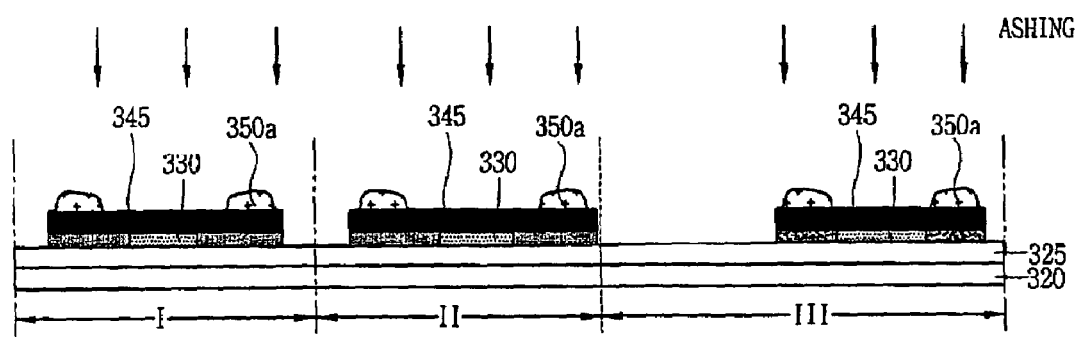

As shown in FIG. 8G, a predetermined thickness of the third photoresist pattern 350 is removed by an ashing process, thereby exposing an upper middle portion of the conductive layer 345.

Figure 8H:
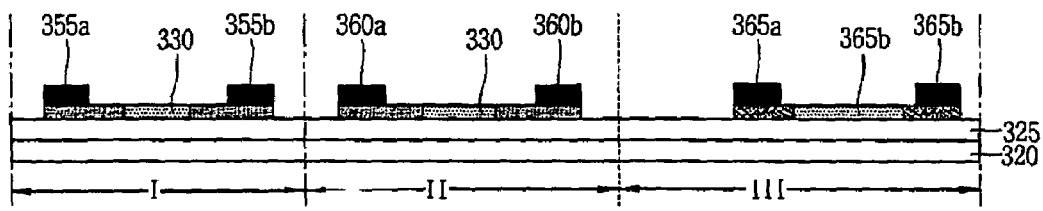

As shown in FIG. 8H, the conductive layer 345 is selectively removed using the third photoresist pattern 350 as a mask, thereby forming a first source/drain 355a and 355b of the pixel portion, a second source/drain 360a and 360b of the driving circuit portion, and a third source/drain 365a and 365b of the driving circuit portion. Then, the third photoresist 350 is removed.

Figure 8I:
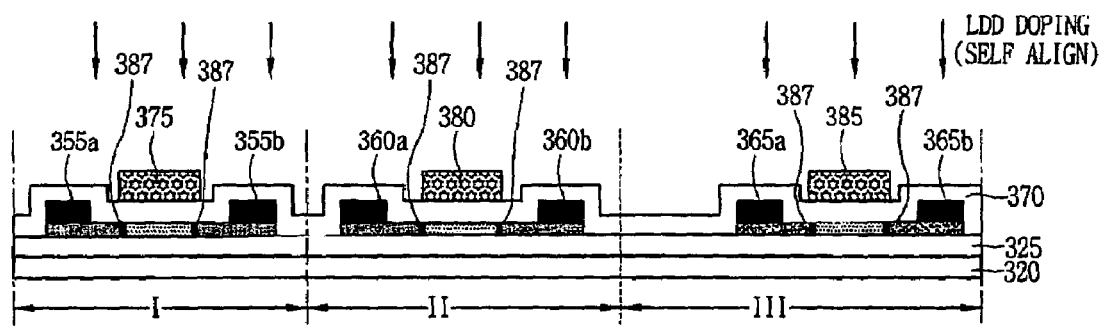

As shown in FIG. 8I, an insulating layer such as silicon oxide $SiO_2$ is deposited on an entire surface of the substrate including the first source/drain 355a and 355b of the pixel portion, the second source/drain 360a and 360b of the driving circuit portion, and the third source/drain 365a and 365b of the driving circuit portion, thereby forming a gate insulating layer 370. A process for activating the gate insulating layer 370 after forming the gate insulating layer is not performed.

Then, a conductive material such as Mo, Al, AlNd, Cr, Cu, or W is deposited on the gate insulating layer 370 and a fourth photoresist is deposited on the conductive material. The fourth photoresist is selectively removed by the fourth mask process S140 thereby forming a fourth photoresist pattern (not shown) for defining a gate electrode. The conductive material is patterned using the fourth photoresist pattern (not shown) as a mask thereby to form gate electrodes 375, 380, and 385. Then, the fourth photoresist pattern (not shown) is removed. The polysilicon layer 330a is doped with n-impurities using gate electrodes 375, 380, and 385 as a mask, thereby forming self-aligned LDD regions 387.

Figure 8J:
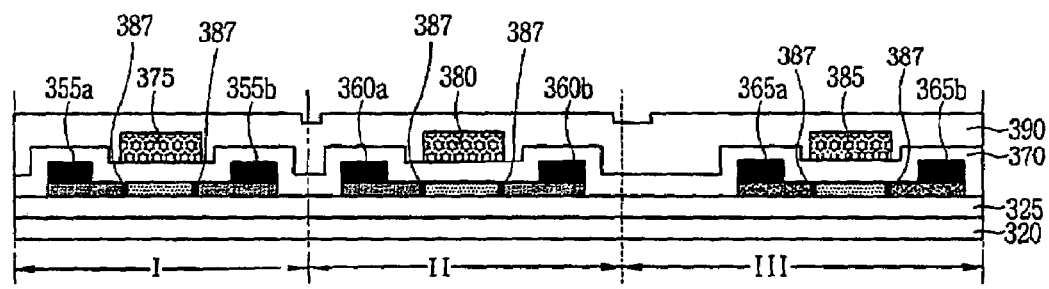

As shown in FIG. 8J, an insulating layer is deposited on the entire surface of the substrate including the gate electrodes 375, 380, and 385 thereby to form a passivation film 390. The insulating layer may comprise one or more inorganic materials such as silicon oxide ($SiO_2$) or silicon nitride ($SiN_x$) and/or one or more organic materials such as Benzocyclobutene and Acryl resin. Then, the passivation film 390 is thermally-hydrogenated.

A fifth photoresist is deposited on the passivation film 390 and then the fifth photoresist is selectively removed by the fifth mask process S150, thereby forming a fifth photoresist pattern (not shown) defining a contact hole for connecting a drain electrode to a pixel electrode.

Figure 8K:
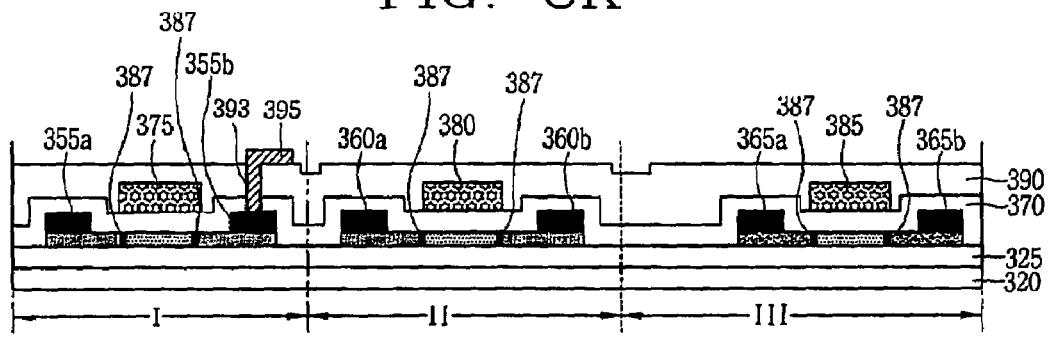

As shown in FIG. 8K, the passivation film 390 and the gate insulating layer 370 below the passivation film 390 are selectively removed using the fifth photoresist pattern (not shown) as a mask, thereby forming a passivation film contact hole 393 exposing the drain 355b of the pixel portion. Then, the fifth photoresist pattern (not shown) is removed.

A transparent conductive material such as indium tin oxide (ITO) or indium zinc oxide (IZO) is deposited on the passivation film 390 where the passivation film contact hole 393 is formed. A sixth photoresist is deposited on the ITO layer and the photoresist is patterned by the sixth mask process SI 60, thereby forming a sixth photoresist pattern (not shown). The ITO layer is selectively removed using the sixth photoresist pattern (not shown) as a mask to thereby form a pixel electrode 395 connected to the drain 355b. The sixth photoresist pattern (not shown) is then removed.

As mentioned above, in the method for fabricating a thin film transistor for an LCD device according to the present invention, the conventional 8-mask process can be reduced into a 6-mask process by etching the activate region and the source/drain regions by diffraction-exposure, forming the LDD layer using PR ashing, and by removing the inter-insulating layer. As the 6-mask process is applied to fabricate the LCD device, the number of masks is reduced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a thin film transistor for an LCD device, comprising:
   forming a semiconductor layer on an entire surface of a substrate, the substrate containing a pixel portion in which a first device is to be formed and a driving circuit portion in which a second and a third device are to be formed;
   forming using at most six mask processes a first photoresist pattern on the semiconductor layer of the first device, the entire second device, and a gate forming region of the third device;
   doping the semiconductor layer of the third device with a first impurity using the first photoresist pattern as a mask;
   removing the first photoresist pattern and forming a second photoresist pattern on a gate forming region of the first device, a gate forming region of the second device, and a part of the third device;
   doping the semiconductor layer of the first and second devices with a second impurity using the second photoresist pattern as a mask;
   forming a conductive layer and a photoresist on an entire surface of the substrate and then partially etching the photoresist by a diffraction exposure to form a third photoresist pattern;
   patterning the conductive layer and the semiconductor layer using the third photoresist pattern as a mask to define source and drain regions and an active region;
   etching the diffraction-exposed third photoresist pattern positioned at channel regions of the first, second and third devices to expose the conductive layer;
   etching the conductive layer using the third photoresist pattern as a mask to form a source and drain of the first, second, and third devices;
   removing the third photoresist pattern and then forming a gate insulating layer on an entire surface of the substrate;
   forming a gate conductive layer on the gate insulating layer and then forming a fourth photoresist pattern on the gate conductive layer;
   etching the gate conductive layer using the fourth photoresist pattern as a mask to form gates of the first, second, and third devices;
   removing the fourth photoresist pattern and then forming a passivation film on an entire surface of the substrate;
   forming a fifth photoresist pattern on the passivation film and then etching the passivation film using the fifth photoresist pattern as a mask to expose the source or drain of the first device;
   removing the fifth photoresist pattern and then forming a transparent electrode layer on the passivation film, the transparent electrode connected to the source or drain of the first device; and
   forming a sixth photoresist pattern on the transparent electrode and then etching the transparent electrode layer using the sixth photoresist pattern as a mask to form a pixel electrode.

2. The method of claim 1, wherein forming the semiconductor layer comprises:
   forming an amorphous silicon layer on the substrate;
   dehydrogenating the amorphous silicon layer; and
   laser-crystallizing the dehydrogenated amorphous silicon layer into a poly-silicon layer.

3. The method of claim 1, wherein doping the semiconductor layer with the first impurity comprises forming a p+ semiconductor layer, and doping the semiconductor layer with the second impurity comprises forming an n+ impurity semiconductor layer.

4. The method of claim 1, wherein an exposure amount of channel regions of the first, second, and third devices is more than an exposure amount of the source and drain regions during diffraction exposure.

5. The method of claim 1, further comprising activating the gate insulating layer before forming the gate metal layer.

6. The method of claim 1, further comprising hydrogenating the passivation film before forming the fifth photoresist pattern.

7. The method of claim 1, wherein forming the semiconductor layer comprises:
   forming an amorphous silicon layer on the substrate; and
   dehydrogenating the amorphous silicon layer.

8. The method of claim 1, further comprising performing ashing process to selectively removing the second photoresist pattern and performing LDD doping process.

9. The method of claim 8, further comprising laser-crystallizing the amorphous silicon layer after removing the second photoresist pattern after performing the LDD doping.

10. The method of claim 1, wherein the conductive layer is exposed by ashing the diffraction-exposed third photoresist pattern.

11. The method of claim 1, further comprising performing an LDD (light doped drain) doping process after forming gates of the first, second and third devices.

12. The method of claim 11, wherein the LDD doping process is performed by the gates of the first, second and third devices as a mask.

* * * * *